US006814584B2

(12) United States Patent
Zaderej

(10) Patent No.: US 6,814,584 B2
(45) Date of Patent: Nov. 9, 2004

(54) ELASTOMERIC ELECTRICAL CONNECTOR

(75) Inventor: Victor J. Zaderej, St. Charles, IL (US)

(73) Assignee: Molex Incorporated, Lisle, IL (US)

(*) Notice: Subject to any disclaimer, the term of this patent is extended or adjusted under 35 U.S.C. 154(b) by 32 days.

(21) Appl. No.: 10/275,754

(22) PCT Filed: May 11, 2001

(86) PCT No.: PCT/US01/15239

§ 371 (c)(1), (2), (4) Date: Nov. 7, 2002

(87) PCT Pub. No.: WO01/89038

PCT Pub. Date: Nov. 22, 2001

(65) Prior Publication Data

US 2003/0228774 A1 Dec. 11, 2003

(51) Int. Cl.$^{7}$ .......................... H01R 12/00; H05K 1/00

(52) U.S. Cl. .............................. 439/66; 439/67; 439/68

(58) Field of Search ..................................... 439/66–72

(56) References Cited

U.S. PATENT DOCUMENTS

| | | | | | |
|---|---|---|---|---|---|
| 4,070,077 | A | * | 1/1978 | Clark | 439/876 |
| 4,548,451 | A | * | 10/1985 | Benarr et al. | 439/85 |
| 5,049,085 | A | * | 9/1991 | Reylek et al. | 439/91 |
| 5,071,359 | A | * | 12/1991 | Arnio et al. | 439/91 |
| 5,133,119 | A | * | 7/1992 | Afshari et al. | 29/842 |
| 5,360,347 | A | * | 11/1994 | Irlbeck et al. | 439/66 |
| 5,491,892 | A | * | 2/1996 | Fritz et al. | 29/857 |
| 6,142,789 | A | * | 11/2000 | Nolan et al. | 439/66 |
| 2002/0117330 | A1 | * | 8/2002 | Eldridge et al. | 174/260 |
| 2002/0127893 | A1 | * | 9/2002 | Brodsky | 439/66 |

* cited by examiner

*Primary Examiner*—Michael C. Zarroli
(74) *Attorney, Agent, or Firm*—Robert J. Zeitler

(57) ABSTRACT

An electrical connector is used to connect first and second electrical elements together. A body of the connector is fanned from an elastomer with a top surface and a bottom surface. Elastomeric bumps extend from the top and bottom surfaces and holes extend through the pairs of bumps and body. The bumps and holes are metalized. To install the connector, the connector is compressed and held between the first and second elements. The compression of the connector causes the bumps to force the metalized layer of the connector against the first and second elements.

23 Claims, 3 Drawing Sheets

ELASTOMERIC ELECTRICAL CONNECTOR

FIELD OF THE INVENTION

This invention is generally directed to an electrical connector which provides electrical interconnection between two conductive elements. More particularly, the invention contemplates a connector that includes an array of electrical pathways set within a silicone body which uses spring force to provide excellent electrical connection between two conductive elements, such as a silicon die and a circuit board.

BACKGROUND OF THE INVENTION

The interconnection of a silicon die or other electronic devices to circuit boards has typically been done by wire bonding between conductive pads on the silicon die and metal leads which are ultimately soldered onto the circuit board. The metal leads provide input/output connections between the silicon die and the circuit board. The trend is to package more devices in a given area on the circuit board which results in the need for higher lead counts. An increase in lead count has been achieved by making the pitch of the leads smaller and by increasing the number of sides or surfaces from which the leads extend. The limitation of this technique is reached, however, when it is no longer possible to stamp smaller metal lead frames. The result is the need for more input/output connections per die area, higher power densities (i.e. heat) and the need for better packaging techniques.

Examples of such interconnections currently used include the Ball Grid Array (BGA), the CIN::APSE connector produced by Cinch Connector, the Wire on Wafer (WOW) technology developed by Form Factor, Elastomeric Connectors for Electronic Packaging and Testing (U.S. Pat. No. 4,932,883), and the Metalized Particle Interconnect process used by Thomas and Betts.

The BGA was developed to package silicon die onto circuit board substrates with more input/output connections than was possible with metal leaded packaging, such as Quad Flat Packages. This packaging approach utilizes a "high temperature" solder ball attached to pads on the bottom side of the silicon die. By utilizing the entire bottom surface of the die, rather than the perimeter of the die, the number of contacts to the circuit board can be significantly increased when compared to a Quad Flat Pack. This approach requires a substrate such as FR4 or ceramic with plated through holes between the top wire bond pads and the bump pads on the bottom. The bump pads on the bottom have high temperature solder balls mounted to them and then the completed assembly is mounted to the circuit board. This packaging approach is relatively expensive ($0.015 to $0.05 per input/output connection) and does not lend itself to doing wafer level testing in that the die must be packaged prior to burn in testing. The cost of a typical seventy position package is between $1.00 and $3.00.

The second interconnect method, CIN::APSE is primarily used to interconnect high end silicon devices to circuit boards. It includes a flat plastic frame with a grid pattern of holes with a pitch between 0.8 mm and 2 mm into which a piece of gold plated "steel wool" is pressed. This assembly is compressed between the two conductive pads providing electrical contact between them. A typical hold-down force for this connector is two ounces per contact and can result in several hundred pounds of total hold down force. The cost of CIN::APSE connectors averages $0.04 per contact. Thus, the cost of a typical seventy position device is $2.80. This approach to electrical component packaging is relatively expensive and does not lend itself to wafer level testing.

A third technology, Wire On Wafer (WOW), relies on the mounting of metal springs directly onto the silicon die. These springs provide an electrical interconnection between the die and the mating surface such as a circuit board. Its advantages include relatively low cost and the ability to do wafer level testing. The disadvantages include the fact that the memory manufacturers will need to install large amounts of equipment to manufacture and mount the springs onto the die. The viability and cost effectiveness of this packaging approach has not yet been determined.

A fourth approach to silicon packaging relies on using an elastomeric substrate that is selectively metalized on the surface. Through holes are used to electrically connect the bottom pads to the upper pads. The metalized pads on the flat elastomeric surface are offset from the plated through hole such that when then the elastomer is compressed it will not break the electrical connector within the barrel of the plated through hole. An example of this type of connector is described in U.S. Pat. Nos. 5,071,359 and 5,245,751.

The present invention provides an electrical connector which overcomes the problems presented in the prior art and which provides additional advantages over the prior art. Such advantages will become clear upon a reading of the attached specification in combination with a study of the drawings.

OBJECTS AND SUMMARY OF THE INVENTION

A general object of the present invention is to provide an electrical connector which eliminates the need for wire bonding metal leads.

An object of the present invention is to provide an electrical connector which provides more input/output connections per area on the circuit board than is capable with some prior art packaging techniques.

A further object of the present invention is to provide an electrical connector which enables electrical contact between the connector and conductive pads on a circuit board, a silicon die or other electronic device.

Another object of the present invention is to provide an electrical connector which can be manufactured cost effectively.

A specific object of the present invention is to provide an electrical connector which allows for wafer level testing.

Briefly, and in accordance with the foregoing, the present invention discloses an electrical connector which eliminates the need for metal lead frames, provides a greater number of input/output connections per area on the circuit board, provides excellent electrical connection between the devices to be connected, allows for wafer level testing for an entire array of completed integrated chips, and can be cost effectively manufactured. The electrical connector includes an elastomeric base which is formed with through holes and raised elastomeric bumps. The through holes and bumps are metalized to provide an electrical path between the devices to be connected such as a silicon die and the circuit board. The raised bumps are provided on the top and bottom surfaces of the elastomeric base, and through the use of compressive forces enable electrical contact between the conductive pads on the electrical devices and the plated holes. The raised bumps provide spring force to create a good electrical contact, as well as compliance between the devices being interconnected.

Examples of areas of use include surface mount connector mounting, display device interconnection as used for example in liquid crystal displays (LCDs), as well as interconnection of various silicon devices.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DESCRIPTION OF THE PREFERRED EMBODIMENTS

Figure 1:
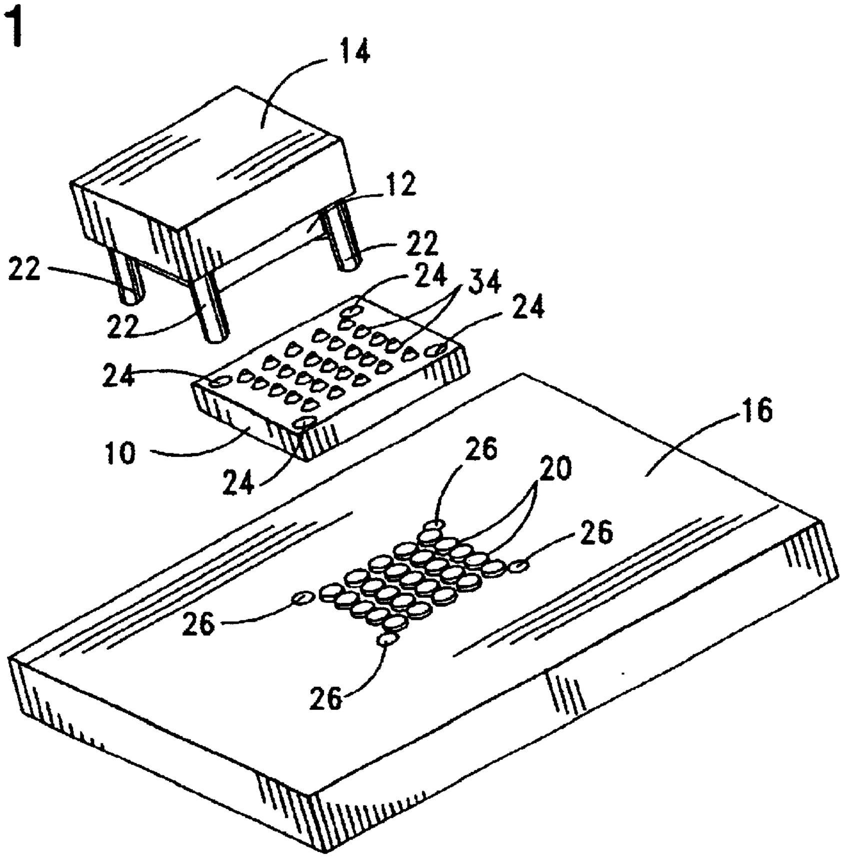
FIG. 1 is an exploded perspective view of the electrical connector which incorporates the features of a first embodiment of the invention, a silicon die placed within a cover, and a circuit board to which the silicon die is to be connected by the electrical connector.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

Figure 3:
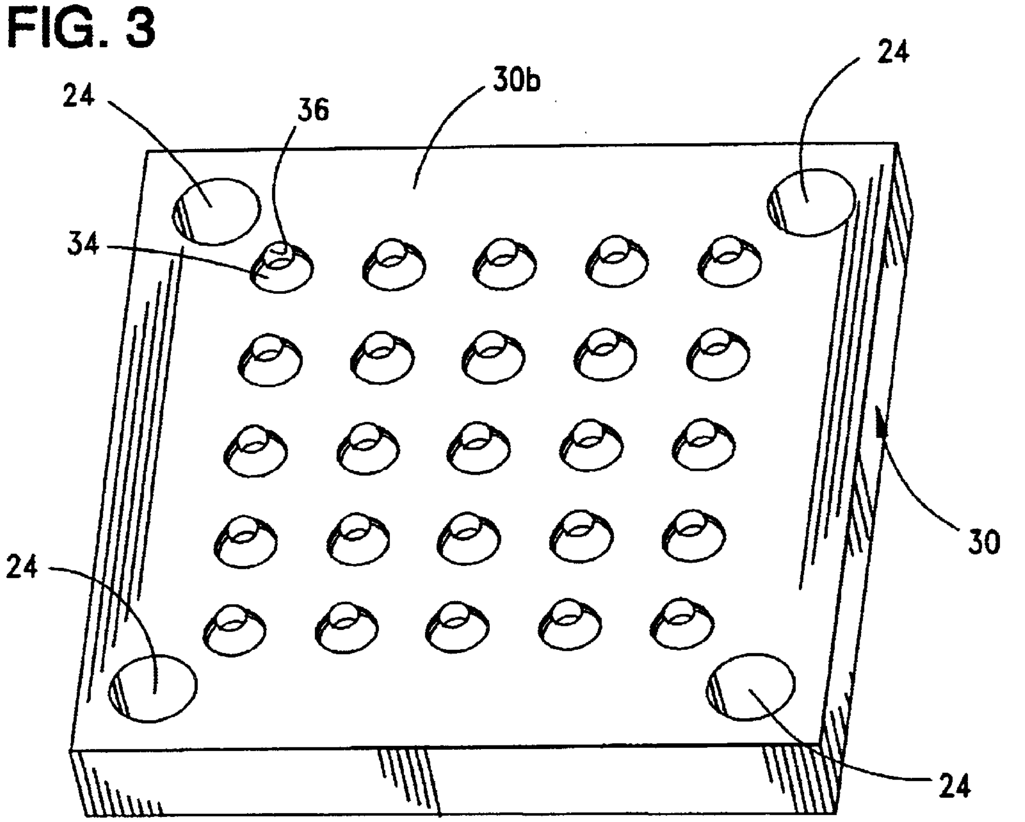
FIG. 3 is a top perspective view of the electrical connector of FIG. 1.
Figure 4:
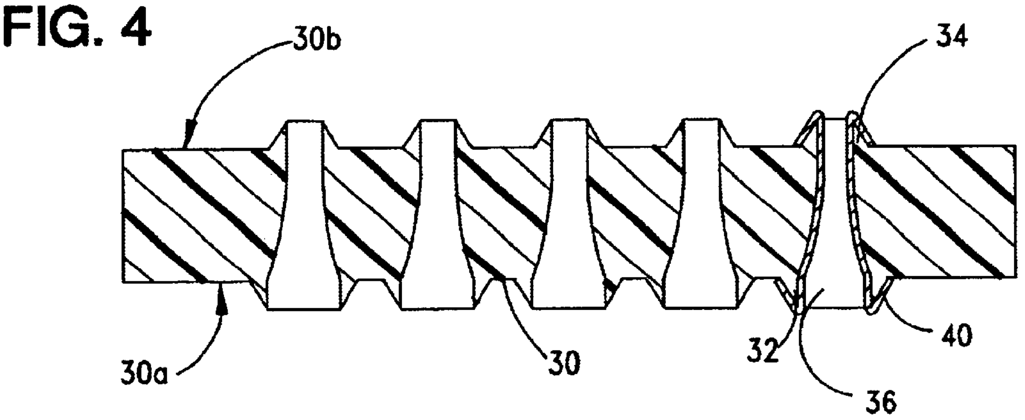
FIG. 4 is a cross-sectional view of the electrical connector along line 3—3 of FIG. 2.
Figure 5:
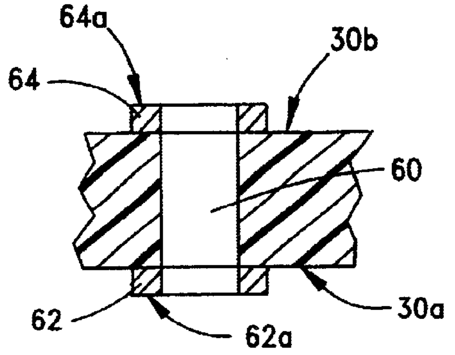
FIG. 5 is a fragmentary cross-sectional view of the electrical connector incorporating features of a second embodiment of the present invention.
Figure 6:
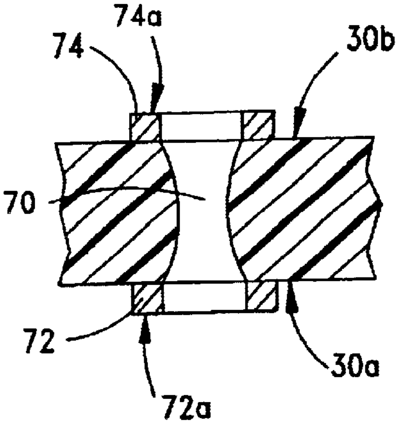
FIG. 6 is a fragmentary cross-sectional view of the electrical connector incorporating features of a third embodiment of the present invention.
Figure 7:
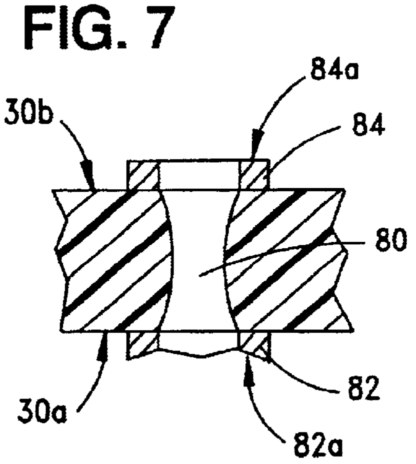
FIG. 7 is a fragmentary cross-sectional view of the electrical connector incorporating features of a fourth embodiment of the present invention.
Figure 8:
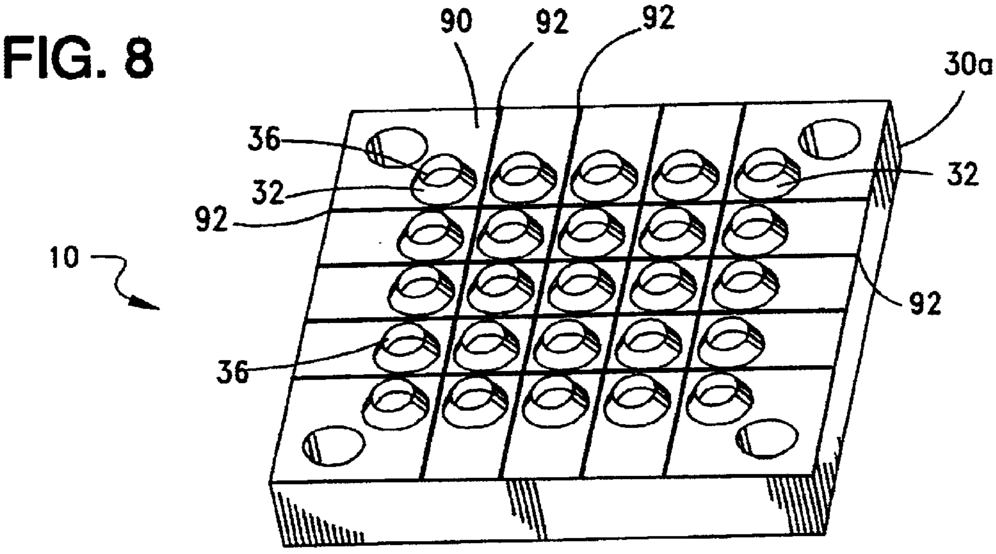
FIG. 8 is a bottom perspective view of an electrical connector which incorporates a fifth embodiment of the present invention.
Figure 9:
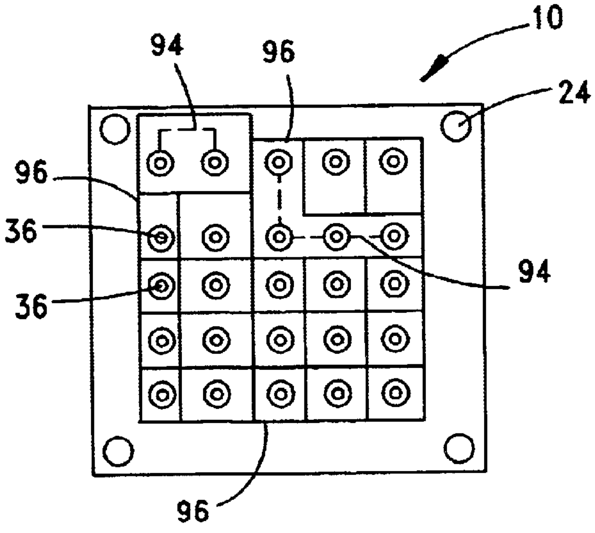
FIG. 9 is a bottom plan view of a connector which incorporates the features of a sixth embodiment of the present invention.

A first embodiment of the present invention is shown in FIGS. 1 through 4, a second embodiment of the present invention is shown in FIG. 5, a third embodiment of the present invention is shown in FIG. 6, a fourth embodiment of the present invention is shown in FIG. 7, a fifth embodiment of the present invention is shown in FIG. 8, and a sixth embodiment of the present invention is shown in FIG. 9.

Attention is invited to the first embodiment of the connector 10 shown in FIGS. 1–4. As shown in FIG. 1, the electrical connector 10 provides connection between two devices, such as, a silicon die 12 and a circuit board 16. While the connection of the silicon die 12 and circuit board 16 is described, it is to be understood the electrical connector 10 of the present invention can be used to connect a variety of electrical devices. The silicon die 12 includes metal contact pads (not shown) spaced from each other and aligned in rows and columns. The silicon die 12 is housed in a cover 14. Four mounting posts 22 (three of which are shown) are provided on the cover 14 for reasons described herein. The circuit board 16 includes contact pads 20 spaced from each other and aligned in rows and columns. The circuit board 16 also includes four mounting holes 26 therethrough.

Figure 2:
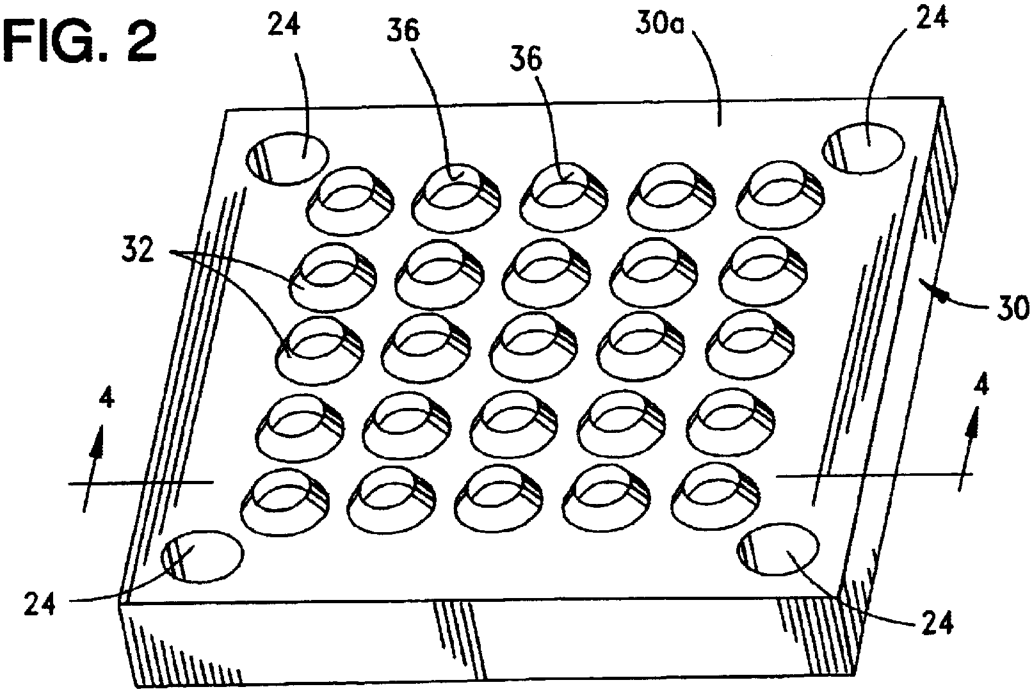
FIG. 2 is a bottom perspective view of the electrical connector of FIG. 1.

As shown in FIGS. 2 and 3, the electrical connector 10 includes a body 30 formed from an elastomeric substance which is selectively plated or metalized as described herein. The body 30 has a bottom surface 30*a*, FIG. 2, and a top surface 30*b*, FIG. 3. As shown in the drawings, the body 30 is rectangular, although it is to be understood that the body 30 can take other shapes.

An array of elastomeric bumps 32 extends from the bottom surface 30*a* of the body 30 and an array of elastomeric bumps 34 extends from the top surface 30*b* of the body 30. The diameters of the bumps 32 are larger than the diameters of the bumps 34. The bumps 32, 34 are annularly shaped and the surface of each bump 32, 34 is sloped such that the diameter of each bump 32, 34 near the respective surfaces 30*a*, 30*b* of the main body 30 is larger than the diameter of the bumps 32, 34 at its outer most surface. The bumps 32 are spaced from each other and aligned in rows and columns on the surface 30*a* of the body 30 in a manner similar to the contact pads 20 on the circuit board 16. The bumps 34 are spaced from each other and aligned in rows and columns on the surface 30*b* of the body 30 in a manner similar to the contact pads (not shown) on the silicon die 12. Respective bumps 32 are vertically aligned with respective bumps 34 so as to create pairs of bumps. The bumps 32, 34 are raised above the surfaces 30*a* and 30*b* of the body 30 and are preferably shaped to act like a spring washer such as, for example, a Bellville spring washer.

A through hole 36 defined by a wall extends through each pair of aligned bumps 32, 34 and through the body 30. Each through hole 36 is preferably centrally located within the bumps 32, 34. As best shown in FIG. 4, each through hole 36 is contoured or tapered such that the diameter of each through hole 36 at each bump 32 is larger than the diameter of each through hole 36 at each bump 34.

Mounting holes 24 extend through the body 30 from the bottom surface 30*a* to the top surface 30*b*. The mounting holes 24 are spaced from each corner of the body 30.

The bumps 32, 34 are preferably integrally formed with the body 30. The body 30 and bumps 32, 34 are made from an elastomeric substance such as, for example, silicone or a fluoroelastomer such as, for example, VITON®. The body 30, bumps 32, 34, through holes 36 and mounting holes 24 can be molded using a process called liquid injection molding (LIM). Silicone and VITON®, for example, provide the desired characteristics in that they are moldable, they provide high temperature, low compression set, good electrical properties and are selectively metalizeable. Suitable fillers can be added to these materials to make the thermal expansion properties (CTE) of the connector 10 approach that of metals such as copper. For example, the CTE for silicone is in the range of 150–300 ppm/° C., but can be reduced to approximately 75 ppm/° C. by adding silicate fillers. Copper has a CTE of approximately 17 ppm/° C. Aluminum has a CTE of approximately 27 ppm/° C. An example of silicone material that has a CTE of 20 ppm/° C. is GE MC550.

The surface of the through holes 36 and the bumps 32, 34 are metalized. As shown in FIG. 4, metalization is achieved by depositing a layer of metal 40 on the surface of the bumps 32, 34 and along the wall which forms the through holes 36.

This metalization can be copper, nickel, gold, tin, aluminum, chromium, titanium or a combination of these metals, or other suitable conductive metal(s). Copper and gold are preferred because of their ductility. The through holes 36 and the bumps 32, 34 can be metalized by using a direction vacuum deposition process, such as, for example, sputtering wherein metal is vaporized and directed toward the surface to be metalized. This approach can be used to either apply the fill thickness of metalization or be used to apply a base or seed layer that could then be increased in thickness with a variety of other plating methods. Other techniques, such as, electroplating, electroless plating and the like could also be used to accomplish the metalization.

As it is only necessary to metalize those through holes 36 and the associated bumps 32, 34 which are needed to provide electrical connection between the silicon die 12 and the circuit board 16, the through holes 36 and bumps 32, 34 may be selectively metalized. A simple and cost effective method to selectively metalize the through holes 36 and bumps 32, 34 is to place a mask onto the surface of the silicone array connector 10 before depositing the appropriate metalization onto the surface. Other methods for selectively metalizing the through holes 36 and bumps 32, 34 can be utilized.

In use, the connector 10 is compressed between the silicon die 12 and the circuit board 16. The mounting posts 22 on the cover 14 are passed through the mounting holes 24 on the body 30 of the connector 10, and then through the mounting holes 26 of the circuit board 16. Features (not shown) at the ends of the four posts 22 secure the cover 14 and silicon die 12 to the connector 10 and the circuit board 16. The connection of the posts 22 to the circuit board 16 results in a compressive force applied to the connector 10. As the compressive force is applied, the bumps 32 on the bottom surface 30*a* of the connector 10 are forced against the contact pads 20 on the top surface of the circuit board 16 and the bumps 34 on the top surface 30*b* of the connector 10 are forced against the contact pads (not shown) on the bottom surface of the silicon die 12. The typical contact force between the bumps 32, 34 and the mating contact pads is approximately 5 to 50 grams per contact. This compresses the bumps 32, 34 and provides a constant force between the mating contacts (not shown) of the silicon die 12 and the bumps 32. A constant force is also provided between the contacts 20 on the circuit board 16 and the bumps 34. The bumps 32, 34 provide consistent force between the connector 10 and the die 12 and between the connector 10 and the circuit board 16, but also result in a wiping action between these metalized surfaces ensuring good electrical contact between them. Although only one clamping assembly has been shown and described various clamping assemblies could be used to mount the die 12 to the connector 10 and to the circuit board 16.

As can be seen in FIG. 4, the through holes 36 may contoured. The purpose of contouring the through holes 36 is two fold. First, contouring of the through holes 36 minimizes the stress between the metalization 40 and the elastomeric body 30 which results from the compressive forces applied upon installation of the silicon die 12 and cover 14 to the circuit board 16. Using through holes with straight walls may increase the tendency of the metal along the surface of the through holes to "buckle" during compression potentially creating an open circuit between the bump 32 and the bump 34. Second, contouring of the through hole 36 simplifies the process of metalizing the through hole 36 because the contour allows the surface of the through hole to be plated to be in the "line-of-sight" relative to the means used for metalizing the through hole.

As shown in FIGS. 5–7, the elastomeric bumps 32, 34 and the through holes 36 of the connector 10 may be of varying shapes. It is to be understood that these bumps 62, 64, 72, 74, 82, 84 and through holes 60, 70, 80 are to be substituted for the bumps 32, 34 and through holes 36 shown in the first embodiment.

FIG. 5 illustrates a through hole 60 and corresponding spring bumps 62, 64 which incorporate the features of a second embodiment of the present invention. The through hole 60 is of uniform diameter from the bottom surface 30*a* of the main body 30 of the connector 10 to the top surface 30*b* of the main body 30. The elastomeric bumps 62, 64 are cylindrically shaped and have flat contact surfaces 62*a*, 64*a*.

FIG. 6 illustrates a through hole 70 and corresponding elastomeric bumps 72, 74 which incorporate features of a third embodiment of the present invention. The through hole 70 is hour-glass shaped with the diameter at its center smaller than the diameter at the bottom surface 30*a* and top surface 30*b*. The elastomeric bumps 72, 74 are cylindrically shaped and have flat contact surfaces 72*a*, 74*a*.

FIG. 7 illustrates a through hole 80 and corresponding elastomeric bumps 82, 84 which incorporates features of a fourth embodiment of the present invention. The through hole 80 is hour-glass shaped with the diameter at its center smaller than the diameter at the bottom surface 30*a* and the top surface 30*b*. The bumps 82, 84 are generally cylindrically shaped, however, the contact surface 82*a* of the bump 82 is rippled and the contact surface 84*a* of the bump 84 is flat. The rippled surface 82*a* allows for several points of contact between the connector 10 and the circuit board 16 while reducing the electrical resistance between the contact surface 82*a* and the contact 20 on the circuit board 16. It is to be understood that the rippled surface 82*a* can take a variety of shapes. For example, the surface 82*a* could include any number of peaks spaced from each other. In addition to including a number of peaks, the surface 82*a* could also be sloped as described with respect to the first embodiment of the invention. In addition, the rippled surface illustrated in FIG. 7 is not limited to the embodiment of FIG. 7, but may be used in any of the embodiments described or contemplated herein, and the rippled surface may be on the bumps located on either or both sides of the connector.

As described above, the through holes 36 and bumps 32, 34 can be selectively metalized by using a masking process. Alternatively, as shown in FIG. 8, at least one surface 30*a*, 30*b* of the body 30 including the bumps 32, 34 and the through holes 36, can be metalized to provide a metalized layer 90 over at least one entire surface of the connector 10. Suitable metals include copper, nickel, gold, tin, aluminum, titanium, chromium or a combination of these metals, or other suitable conductive metal(s). Pathways 92 are then etched, such as by laser scribing, through the metalized surface 90 so as to expose the elastomeric surface of the body 30 along the laser scribed pathways 92. By providing laser scribed pathways 92 around each through hole 36 and its associated pair of bumps 32, 34, each through hole 36 and each pair of bumps 32, 34 is electrically isolated from the remaining through holes 36 and pairs of bumps 32, 34. It is to be understood that each through hole can be electrically isolated from the remaining through holes without providing laser scribed paths around each bump pair. Rather, isolation can still be accomplished if the path is placed through a portion of the bump 32, 34. Moreover, by selectively choosing the pathways, one can selectively isolate certain through holes from other through holes while at the same time electrically connecting other of the through holes.

In an alternative, as shown in FIG. 9, the entire surface is metalized, and then a pattern 96 is created into the metalization down to the elastomeric surfaces 30*a* and 30*b* of the connector 10 between selected through holes 32, 34. The pattern 96 thereby isolates those selected through holes 36 from each other. By not creating a pattern between certain of the through holes results in those selected through holes being electrically connected together. The pattern can be made by any known method, for example, laser scribing or photolithography.

The connector 10 of the present invention allows users to interconnect the silicon die 12 directly onto the circuit board 16. The posts 22 of the plastic cover 14 clamp the die 12 between the cover 14 and the circuit board 16. The compressive force which results from this clamping actions creates an excellent electrical contact between the metalized bumps 32, 34 on the connector 10 and the contacts on the silicon die 12 and the circuit board 16. The cost of manufacturing the silicone array connector is anticipated to be significantly lower than prior art methods. In addition, most die manufacturers will not need to install any additional equipment to manufacture the connector 10 of the present invention resulting in a cost effective approach to electrically packaging a silicon die 12 to a circuit board 16.

Although an array of bumps 32, 34 and through holes 36 is shown and described, the bumps and through holes need not be arranged in rows and columns but can be placed in any arrangement so desired. It is only necessary that the bumps 32 on surface 30*a* align with the selected contact pads 20 on the circuit board 16 and that the bumps 34 on surface 30*b* align with the selected contact pads on the silicon die 12 and the bump pairs align with each other. Additionally, although the connector 10 has been described as including several through holes 36 and pairs of bumps 32, 34, it is possible that given a particular application, only one through hole and pair of bumps is needed to provide the necessary electrical connection.

While preferred embodiments of the present invention are shown and described, it is envisioned that those skilled in the art may devise various modifications of the present invention without departing from the spirit and scope of the appended claims.

What is claimed is:

1. A connector for electrically connecting electrical contacts on a first element to electrical contacts on a second element comprising:

an elastomeric body having a first surface and a second surface;

an elastomeric bump extending from said first surface;

an elastomeric bump extending from said second surface;

a hole, defined by a wall, extending through said bumps and said body; and a metal coating on said bumps and on said wall defining said hole.

2. The connector as defined in claim 1, wherein said body and said bumps are integrally formed.

3. The connector as defined in claim 1, wherein said elastomeric body, said elastomeric bumps and said hole are integrally formed.

4. The connector as defined in claim 1, wherein said elastomeric body and said bumps have a coefficient of thermal expansion of approximately 77 ppm/° C. or less.

5. The connector as defined in claim 1, wherein said bump on said first surface are vertically aligned with said bump on said second surface.

6. The connector as defined in claim 1, wherein each said bump includes a surface, and said surface of at least one of said bumps is rippled.

7. The connector as defined in claim 1, wherein said wall which defines said hole is tapered.

8. The connector as defined in claim 1, wherein each said bump has a predetermined diameter and said diameter of said bump on said first surface is smaller than said diameter of said bump on said second surface.

9. The connector as defined in claim 1, wherein said coating is formed from one of the group of copper, nickel, gold, tin, aluminum, titanium and chromium, or a combination of copper, nickel, gold, tin aluminum, titanium and chromium.

10. The connector as defined in claim 1, wherein said hole is vertically aligned with the electrical contacts on the first element and the electrical contacts on the second element.

11. The connector as defined in claim 1, wherein said elastomeric bumps are compressed upon electrically connecting the electrical contact on the first element to the electrical contact on the second element.

12. A connector for electrically connecting electrical contacts on a first element to electrical contacts on a second element comprising:

an elastomeric body having a first surface and a second surface;

a plurality of elastomeric bumps extending from said first surface;

a plurality of elastomeric bumps extending from said second surface;

respective ones of said elastomeric bumps extending from said first surface being aligned with respective ones of said elastomeric bumps extending from said second surface to form a plurality of bump pairs;

a plurality of holes, defined by walls, respective ones of said holes extending through a bump pair and said body; and a metal coating on said plurality of bumps and on said walls defining said plurality of holes.

13. The connector as defined in claim 12, wherein said elastomeric body and said bumps has a coefficient of thermal expansion of approximately 75 ppm/° C. or less.

14. The connector as defined in claim 12, wherein at least one of said first and second surfaces is metalized and wherein at least one of said plurality of holes is electrically isolated from said other of said plurality of holes.

15. The connector as defined in claims 12, wherein said bumps which form said bump pairs are vertically aligned.

16. The connector as defined in claim 12, wherein each said bump includes a surface and at least one of said surfaces is rippled.

17. The connector as defined in claim 12, wherein each said wall which defines each said hole extending through said bump pair and said body is tapered.

18. The connector as defined in claim 12, wherein each said bump has a predetermined diameter and said diameters of said bumps on said first surface are smaller than said diameters of said bumps on said second surface.

19. The connector as defined in claim 12, wherein said coating is formed from one of the group of copper, nickel, gold, tin, aluminum, titanium or chromium, or a combination of copper, nickel, gold, tin, aluminum, titanium and chromium.

20. A method of forming an electrical connector comprising the steps of:

forming an elastomeric body with first and second surfaces including a plurality of elastomeric first bumps extending from said first surface, a plurality of elastomeric second bumps extending from said second surface, respective ones of said first bumps and said second bumps being aligned to form bump pairs, and a hole extending through said body and each said respective bump pair thereby defining a plurality of holes, each said hole being defined by a wall; and metalizing said bump pairs and holes.

21. The method as defined in claim 20, wherein said metalizing is formed by directional vacuum deposition.

22. The method as defined in claim 20, wherein at least one of said first and second surfaces of said body is metalized and wherein a oath is etched around at least one of said holes to electrically isolate said at least one of said plurality of holes from said other of said plurality of holes.

23. A connector assembly comprising:

a first element including electrical contacts;

a second element including electrical contacts;

a connector positioned between said first and said second elements, said connector including, an elastomeric body having a first surface and a second surface, an elastomeric bump extending from said first surface, an elastomeric bump extending from said second surface, a hole, defined by a wall, extending through said bumps and said body, and a metal coating on said bumps and on said wall defining said hole; and wherein upon application of a compressive force to the connector assembly, said elastomeric bumps are compressed.

* * * * *